United States Patent
Yeh et al.

(10) Patent No.: US 12,274,032 B2
(45) Date of Patent: Apr. 8, 2025

(54) TWO-PHASE IMMERSION-TYPE HEAT DISSIPATION STRUCTURE HAVING SHEET-LIKE HEAT DISSIPATION FINS

(71) Applicant: AMULAIRE THERMAL TECHNOLOGY, INC., New Taipei (TW)

(72) Inventors: Tze-Yang Yeh, New Taipei (TW); Ching-Ming Yang, New Taipei (TW); Chun-Te Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 280 days.

(21) Appl. No.: 17/945,065

(22) Filed: Sep. 14, 2022

(65) Prior Publication Data
US 2024/0090173 A1    Mar. 14, 2024

(51) Int. Cl.
H05K 7/20        (2006.01)
(52) U.S. Cl.
CPC ........... *H05K 7/2039* (2013.01); *H05K 7/203* (2013.01)
(58) Field of Classification Search
CPC ............................. H05K 7/2039; H05K 7/203
USPC ................................................. 165/80.3, 80.4
See application file for complete search history.

(56) References Cited

U.S. PATENT DOCUMENTS

| | | | | |
|---|---|---|---|---|
| 6,675,885 B2* | 1/2004 | Kuo | ............... | H01L 23/3672 174/16.3 |
| 7,355,148 B2* | 4/2008 | Boussier | ............... | F24H 3/002 219/544 |
| 7,650,929 B2* | 1/2010 | Huang | ............... | F28F 1/32 165/104.33 |
| 9,500,413 B1* | 11/2016 | Rice | ............... | F28D 15/0233 |
| 9,538,693 B2* | 1/2017 | Kurz | ............... | H05K 9/0032 |
| 10,731,924 B2* | 8/2020 | Huang | ............... | F28D 15/043 |
| 11,940,231 B2* | 3/2024 | Zhang | ............... | F28D 15/06 |
| 2007/0261242 A1* | 11/2007 | Xia | ............... | B23P 15/26 257/E23.103 |
| 2010/0157541 A1* | 6/2010 | Zhu | ............... | H01L 23/433 361/710 |
| 2011/0315343 A1* | 12/2011 | Campbell | ............... | H05K 7/203 165/80.3 |
| 2016/0165755 A1* | 6/2016 | Bodenweber | ............... | H05K 1/181 165/80.2 |
| 2019/0264986 A1* | 8/2019 | Chen | ............... | F28F 1/40 |

(Continued)

*Primary Examiner* — Claire E Rojohn, III
(74) *Attorney, Agent, or Firm* — Li & Cai Intellectual Property Office

(57) ABSTRACT

A two-phase immersion-type heat dissipation structure having high density heat dissipation fins is provided. The two-phase immersion-type heat dissipation structure having high density heat dissipation fins includes a heat dissipation substrate, a plurality of sheet-like heat dissipation fins, and a reinforcement structure. A bottom surface of the heat dissipation substrate is in contact with a heating element immersed in a two-phase coolant. The plurality of sheet-like heat dissipation fins are integrally formed on an upper surface of the heat dissipation substrate and arranged in high density. An angle between at least one of the sheet-like heat dissipation fins and the upper surface of the heat dissipation substrate is from 60° to 120°. At least one of the sheet-like heat dissipation fins has a length from 50 mm to 120 mm, a width from 0.1 mm to 0.35 mm, and a height from 2 mm to 8 mm.

9 Claims, 6 Drawing Sheets

(56) References Cited

U.S. PATENT DOCUMENTS

| | | | | |
|---|---|---|---|---|
| 2020/0355441 | A1* | 11/2020 | Lin | B23P 15/26 |
| 2021/0123687 | A1* | 4/2021 | Lin | H05K 7/20336 |
| 2021/0125898 | A1* | 4/2021 | Torresin | F28F 1/26 |
| 2021/0259134 | A1* | 8/2021 | Uppal | H01L 23/10 |
| 2021/0410329 | A1* | 12/2021 | Yang | H05K 7/20254 |
| 2022/0018610 | A1* | 1/2022 | Chen | F28D 15/0283 |
| 2022/0022339 | A1* | 1/2022 | Chen | F28D 15/046 |
| 2022/0319949 | A1* | 10/2022 | Pentikäinen | H01L 23/427 |
| 2023/0070604 | A1* | 3/2023 | Chen | H05K 7/20727 |
| 2023/0184491 | A1* | 6/2023 | Wang | F28D 15/0266 |
| | | | | 165/166 |
| 2024/0085125 | A1* | 3/2024 | Yeh | H01L 23/427 |
| 2024/0090173 | A1* | 3/2024 | Yeh | H05K 7/203 |
| 2024/0102741 | A1* | 3/2024 | Yang | H01L 23/427 |
| 2024/0142180 | A1* | 5/2024 | Yang | F28D 15/02 |
| 2024/0142181 | A1* | 5/2024 | Wu | F28F 21/084 |
| 2024/0147662 | A1* | 5/2024 | Yang | H05K 7/2039 |
| 2024/0155807 | A1* | 5/2024 | Wu | H01L 23/427 |
| 2024/0155808 | A1* | 5/2024 | Wu | H05K 7/203 |
| 2024/0155809 | A1* | 5/2024 | Wu | H05K 7/203 |
| 2024/0224464 | A1* | 7/2024 | Huang | H05K 7/20409 |
| 2024/0237309 | A1* | 7/2024 | Lee | B23K 20/122 |
| 2024/0244793 | A1* | 7/2024 | Wu | H05K 7/203 |
| 2024/0244797 | A1* | 7/2024 | Wu | H01L 23/44 |
| 2024/0247882 | A1* | 7/2024 | Lee | F28F 9/001 |
| 2024/0268078 | A1* | 8/2024 | Yang | H05K 7/20236 |

\* cited by examiner

TWO-PHASE IMMERSION-TYPE HEAT DISSIPATION STRUCTURE HAVING SHEET-LIKE HEAT DISSIPATION FINS

FIELD OF THE DISCLOSURE

The present disclosure relates to a heat dissipation structure, and more particularly to a two-phase immersion-type heat dissipation structure having high density fins.

BACKGROUND OF THE DISCLOSURE

An immersion cooling technology is to directly immerse heat producing elements (such as servers and disk arrays) into a coolant that is non-conductive, and heat generated from operation of the heat producing elements is removed through an endothermic gasification process of the coolant. Therefore, how to dissipate heat more effectively through the immersion cooling technology has long been an issue to be addressed in the industry.

SUMMARY OF THE DISCLOSURE

In response to the above-referenced technical inadequacy, the present disclosure provides a two-phase immersion-type heat dissipation structure having high density heat dissipation fins.

In one aspect, the present disclosure provides a two-phase immersion-type heat dissipation structure having high density heat dissipation fins. The two-phase immersion-type heat dissipation structure includes a heat dissipation substrate, a plurality of sheet-like heat dissipation fins, and a reinforcement structure. A bottom surface of the heat dissipation substrate is in contact with a heating element immersed in a two-phase coolant. The plurality of sheet-like heat dissipation fins are integrally formed on an upper surface of the heat dissipation substrate and arranged in high density. An angle between at least one of the plurality of sheet-like heat dissipation fins and the upper surface of the heat dissipation substrate is from 60 degrees to 120 degrees. A length of at least one of the plurality of sheet-like heat dissipation fins is from 50 mm to 120 mm, a width of at least one of the plurality of sheet-like heat dissipation fins is from 0.1 mm to 0.35 mm, and a height of at least one of the plurality of sheet-like heat dissipation fins is from 2 mm to 8 mm. At least two adjacent ones of the plurality of sheet-like heat dissipation fins that are in parallel arrangement are spaced apart from each other by a distance that is from 0.05 mm to 0.5 mm. A material of the reinforcement structure is different from a material of the heat dissipation substrate, and the reinforcement structure is bonded to the heat dissipation substrate, so that at least a portion of the reinforcement structure protrudes from the upper surface of the heat dissipation substrate by between 2 mm and 20 mm.

In certain embodiments, the length of at least one of the plurality of sheet-like heat dissipation fins is from 50 mm to 80 mm, the width of at least one of the plurality of sheet-like heat dissipation fins is from 0.1 mm to 0.3 mm, and the height of at least one of the plurality of sheet-like heat dissipation fins is from 3 mm to 6 mm. At least two adjacent ones of the plurality of sheet-like heat dissipation fins that are in parallel arrangement are spaced apart from each other by the distance that is from 0.1 mm to 0.3 mm.

In certain embodiments, the heat dissipation substrate is made of copper, copper alloy, or aluminum alloy.

In certain embodiments, the reinforcement structure is bonded to the heat dissipation substrate by soldering, friction stir welding, gluing, diffusion bonding, or press-bonding.

In certain embodiments, the reinforcement structure is made of aluminum alloy or stainless steel.

In certain embodiments, a surface of the reinforcement structure for being bonded with the heat dissipation substrate has a plating layer formed thereon for facilitating a soldering process.

In certain embodiments, the plating layer is an electroless nickel plating layer.

In certain embodiments, the reinforcement structure is a reinforcement outer frame and is surroundingly in contact with side walls of the heat dissipation substrate.

In certain embodiments, the reinforcement outer frame has two reinforcement side walls that are oppositely disposed, and at least one of the reinforcement side walls has at least one through hole that horizontally penetrates the reinforcement side wall.

In certain embodiments, the reinforcement structure is a reinforcement inner frame and is bonded to the upper surface of the heat dissipation substrate. At least a portion of the plurality of sheet-like heat dissipation fins are located in an opening formed by an inner periphery of the reinforcement inner frame, and another portion of the plurality of sheet-like heat dissipation fins are surroundingly arranged along an outer periphery of the reinforcement inner frame.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
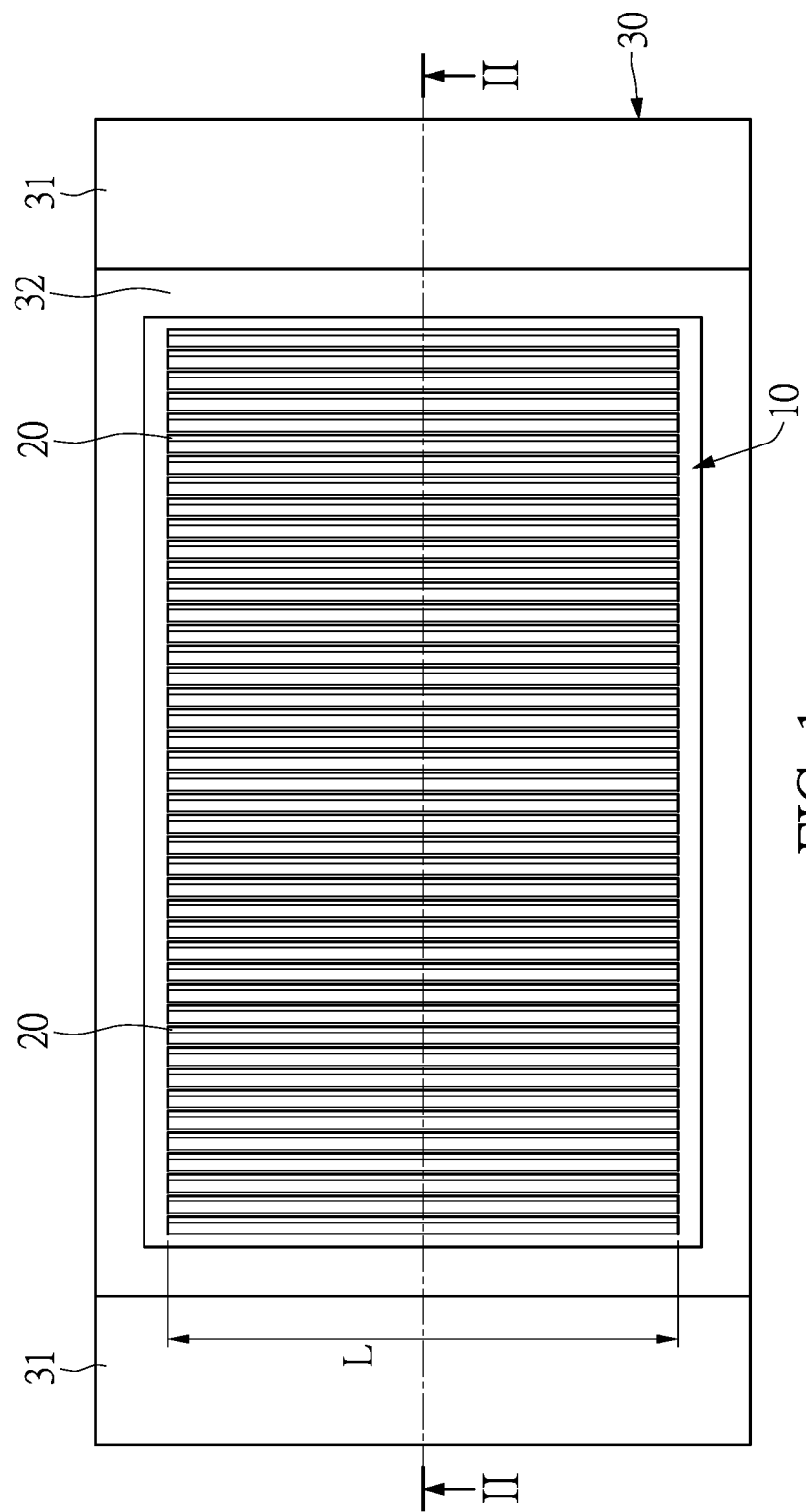
FIG. 1 is a top view of a two-phase immersion-type heat dissipation structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
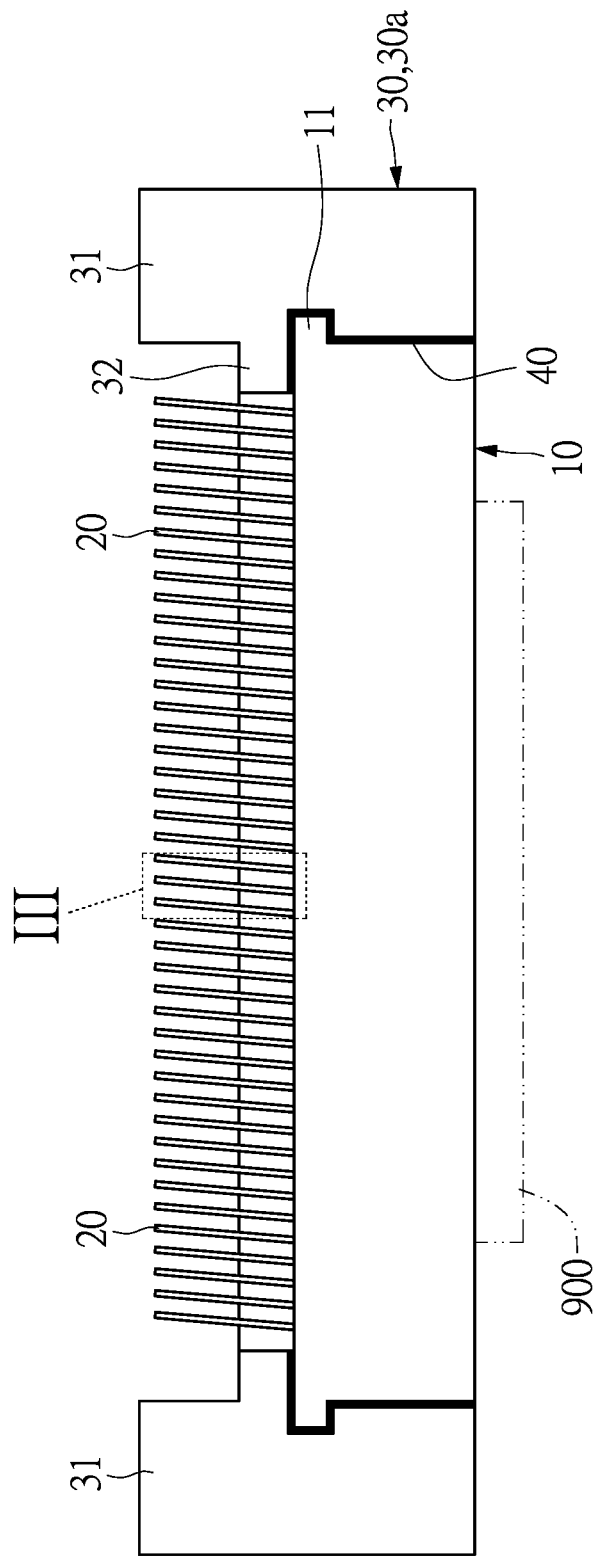
FIG. 2 is a cross-sectional view taken along line II-II of FIG. 1.
Figure 3:
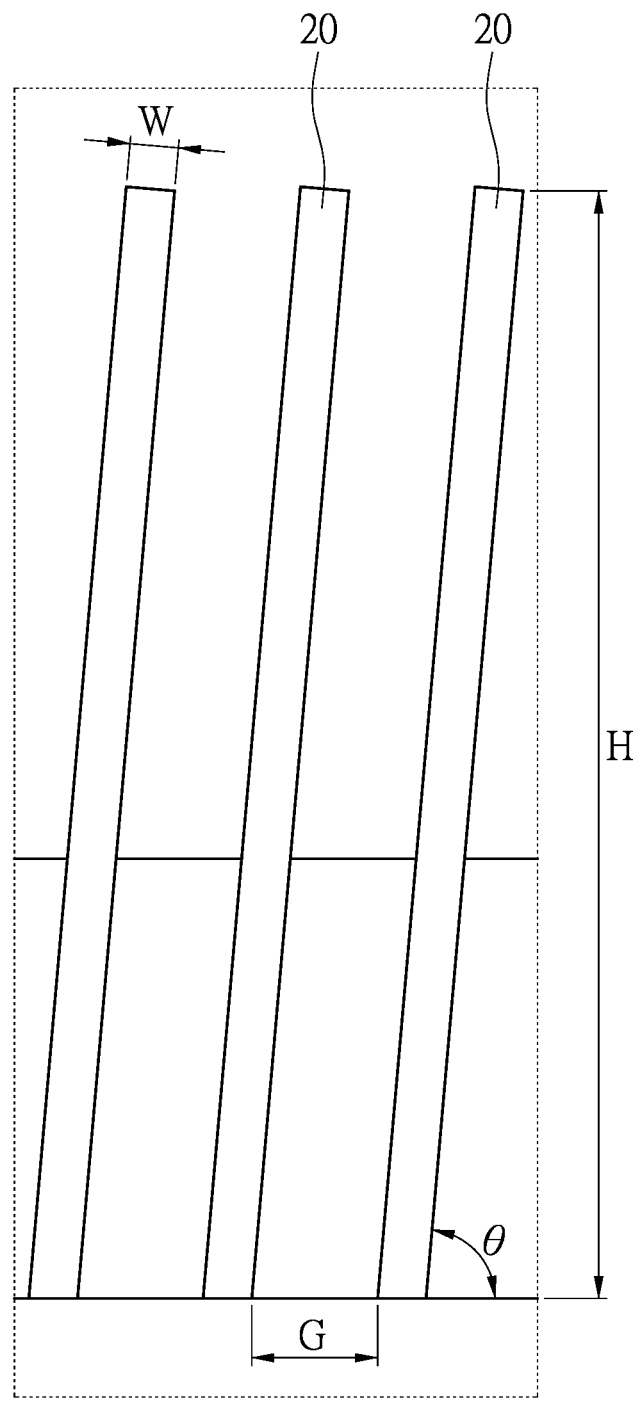
FIG. 3 is an enlarged view of section III of the two-phase immersion-type heat dissipation structure of FIG. 2.

Referring to FIG. 1 to FIG. 4, one embodiment of the present disclosure provides a two-phase immersion-type heat dissipation structure having high density heat dissipation fins for contacting a heating element immersed in a two-phase coolant. As shown in FIG. 1 to FIG. 3, the two-phase immersion-type heat dissipation structure having high density heat dissipation fins provided in this embodiment of the present disclosure includes a heat dissipation substrate 10, a plurality of sheet-like heat dissipation fins, and a reinforcement structure 30.

In this embodiment, the heat dissipation substrate 10 can be made of copper, copper alloy, or aluminum alloy. The plurality of sheet-like heat dissipation fins 20 are integrally formed on an upper surface of the heat dissipation substrate 10. That is, the plurality of sheet-like heat dissipation fins 20 are integrally formed on the upper surface of the heat dissipation substrate 10 and arranged in high density, so that the plurality of sheet-like heat dissipation fins 20 are integrally formed with the heat dissipation substrate 10 by a same material.

Accordingly, a bottom surface of the heat dissipation substrate 10 can be in contact with a heating element 900 immersed in a two-phase coolant 800, so that for the heating element 900 immersed in the two-phase coolant 800, heat generated by the heating element 900 can be removed through an endothermic gasification process of the two-phase coolant 800, and can be removed through the heat dissipation substrate 10 being in contact with the heating element 900 and absorbing the heat generated by the heating element 900. The heat is rapidly conducted to the plurality of sheet-like heat dissipation fins 20 that are very densely and integrally formed on the upper surface of the heat dissipation substrate 10. The heat absorbed by the sheet-like heat dissipation fins 20 is then removed through the endothermic gasification process of the two-phase coolant 800, thereby improving an overall immersion-type heat dissipation effect.

In order to properly improve the overall immersion-type heat dissipation effect, an angle θ between at least one of the plurality of sheet-like heat dissipation fins 20 and the heat dissipation substrate 10 is configured to be from 60 degrees to 120 degrees, a length L of at least one of the plurality of sheet-like heat dissipation fins 20 is from 50 mm to 120 mm, a width W of at least one of the plurality of sheet-like heat dissipation fins 20 is from 0.1 mm to 0.35 mm, a height H of at least one of the plurality of sheet-like heat dissipation fins 20 is from 2 mm to 8 mm, and at least two adjacent ones of the plurality of sheet-like heat dissipation fins 20 that are in parallel arrangement are spaced apart from each other by a distance G that is from 0.05 mm to 0.5 mm. With reference to relevant test results, the length L of at least one of the plurality of sheet-like heat dissipation fins 20 is preferably from 50 mm to 80 mm, the width W of at least one of the plurality of sheet-like heat dissipation fins 20 is preferably from 0.1 mm to 0.3 mm, the height H of at least one of the plurality of sheet-like heat dissipation fins 20 is preferably from 4 mm to 8 mm, and at least two adjacent ones of the plurality of sheet-like heat dissipation fins 20 that are in parallel arrangement are spaced apart from each other by a distance G that is preferably from 0.1 mm to 0.3 mm.

Figure 4:
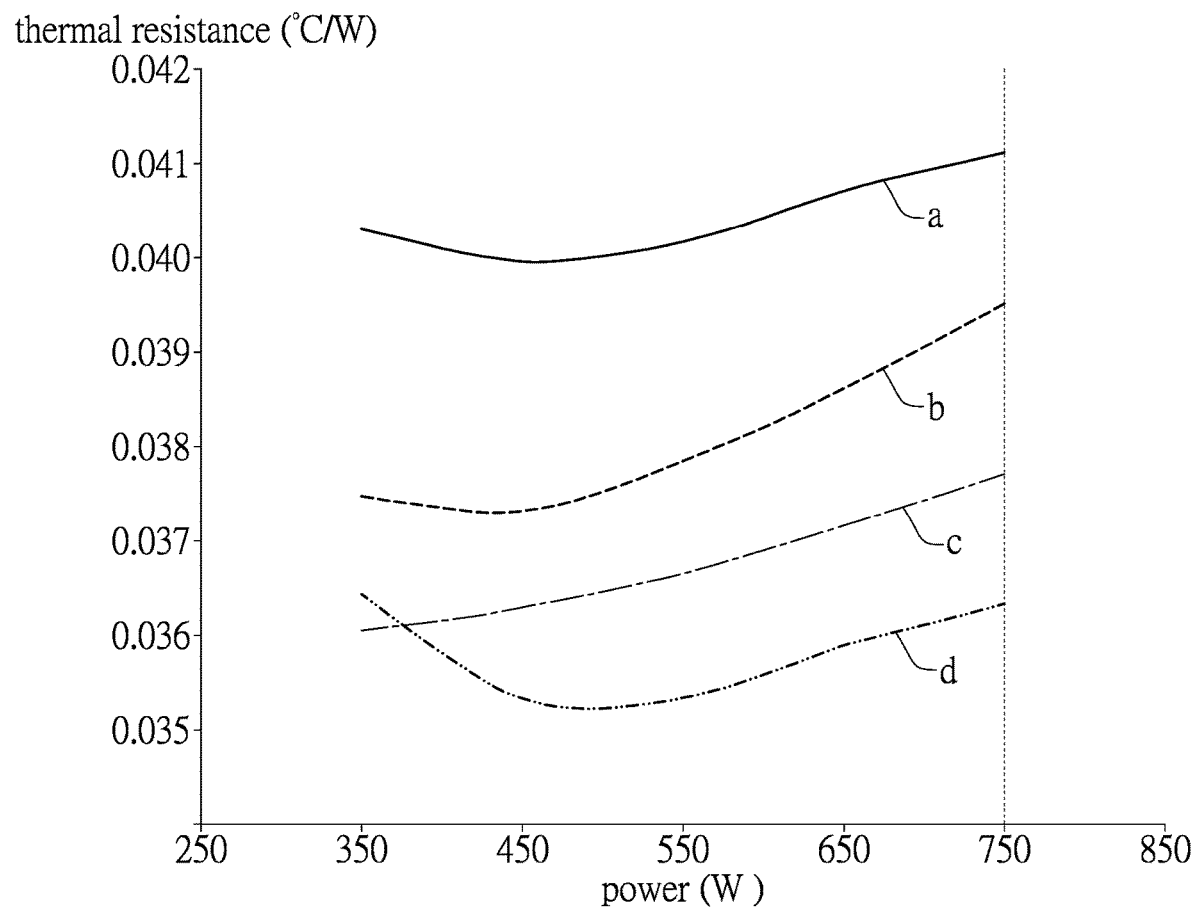
FIG. 4 is a curve diagram showing a relationship between thermal resistance and power according to the present disclosure.

Accordingly, in order to better improve an overall immersion-type heat dissipation effect, through further tests and data shown in curve a of FIG. 4, when at least one of the plurality of sheet-like heat dissipation fins 20 has the width W of 0.35 mm, the height H of 3 mm, and at least two adjacent ones of the plurality of sheet-like heat dissipation fins 20 that are in parallel arrangement are spaced apart from each other by a distance G that is 0.35 mm, a thermal resistance value (the thermal resistance value is a ratio of a variation of temperature of the heat dissipation substrate and a heat generated by the heating element) measured when a power of the heating element 900 is 750 watts (W) is approximately 0.041 (° C./W).

Further, in curve b as shown in FIG. 4, when at least one of the plurality of sheet-like heat dissipation fins 20 has the width W of 0.2 mm, the height H of 3 mm, and at least two adjacent ones of the plurality of sheet-like heat dissipation fins 20 that are in parallel arrangement are spaced apart from each other by a distance G that is 0.2 mm, a thermal resistance value measured when the power of the heating element 900 is 750 watts (W) is approximately 0.0395 (° C./W).

Further, in curve c as shown in FIG. 4, when at least one of the plurality of sheet-like heat dissipation fins 20 has the width W of 0.25 mm, the height H of 6 mm, and at least two adjacent ones of the plurality of sheet-like heat dissipation fins 20 that are in parallel arrangement are spaced apart from each other by a distance G that is 0.25 mm, a thermal resistance value measured when the power of the heating element 900 is 750 watts (W) is approximately 0.0378 (° C./W).

Further, in curve d as shown in FIG. 4, when at least one of the plurality of sheet-like heat dissipation fins 20 has the width W of 0.15 mm, the height H of 6 mm, and at least two adjacent ones of the plurality of sheet-like heat dissipation fins 20 that are in parallel arrangement are spaced apart from each other by a distance G that is 0.15 mm, a thermal resistance value measured when the power of the heating element 900 is 750 watts (W) is approximately 0.0364 (° C./W).

Therefore, through testing, it is shown that when at least one of the plurality of sheet-like heat dissipation fins 20 has the width W of 0.15 mm, the height H of 6 mm, and at least two adjacent ones of the plurality of sheet-like heat dissipation fins 20 that are in parallel arrangement are spaced apart from each other by the distance G that is 0.15 mm, a thermal resistance value measured is the lowest, thereby further improving an overall immersion-type heat dissipation effect.

Further, in order to prevent issues and damages caused by warpage of the heat dissipation substrate 10, and to improve a bonding stability of the heat dissipation substrate 10 to the heating element 900, in this embodiment, a material of the reinforcement structure 30 is different from a material of the heat dissipation substrate 10, and the Young's modulus of the reinforcement structure 30 is greater than the Young's modulus of the heat dissipation substrate 10. Further, the reinforcement structure 30 is bonded to the heat dissipation substrate 10, so that at least a portion of the reinforcement structure 30 protrudes from the upper surface of the heat dissipation substrate 10 by between 2 mm and 20 mm.

Further, in this embodiment, the reinforcement structure 30 can be made of aluminum alloy or stainless steel, and the reinforcement structure 30 can be bonded to the heat dissipation substrate 10 by using techniques such as soldering, friction stir welding, gluing, diffusion bonding, and press-bonding. A surface of the reinforcement structure 30 for being bonded with the heat dissipation substrate 10 has a plating layer 40 formed thereon for facilitating a soldering process, and the plating layer 40 is preferably an electroless nickel plating layer.

In detail, the reinforcement structure 30 in this embodiment can be a reinforcement outer frame 30a surroundingly in contact with side walls of the heat dissipation substrate 10 and have two reinforcement side walls 31 that are oppositely disposed, that is, the reinforcement outer frame 30a can have the two reinforcement side walls 31 that protrude from the upper surface of the heat dissipation substrate 10. Further, a top surface of at least one of the two reinforcement side walls 31 can be flush with a top surface of at least one of the plurality of sheet-like heat dissipation fins 20, or can be higher or lower than the top surface of at least one of the plurality of sheet-like heat dissipation fins 20. Moreover, an inner periphery of the reinforcement outer frame 30a can have an inner protruding portion 32 protruding therefrom, and the inner protruding portion 32 abuts against the upper surface of the heat dissipation substrate 10. Further, an outer periphery of the heat dissipation substrate 10 can have an outer protruding portion 11 protruding therefrom, and the outer protruding portion 11 is embedded into the inner periphery of the reinforcement outer frame 30a so that the reinforcement structure 30 is more stably bonded to the heat dissipation substrate 10.

Second Embodiment

Figure 5:
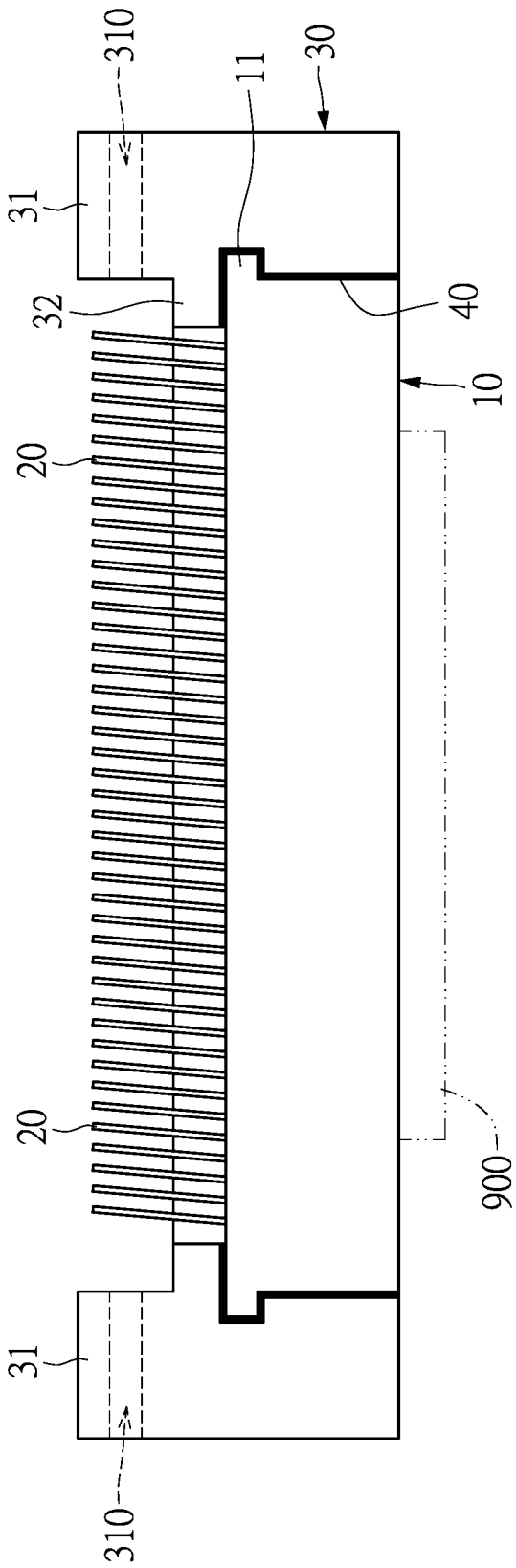
FIG. 5 is a cross-sectional view of the two-phase immersion-type heat dissipation structure according to a second embodiment of the present disclosure.

Referring to FIG. 5, a second embodiment of the present disclosure is substantially the same as the first embodiment, and the difference therebetween is described as follows.

In this embodiment, at least one of the reinforcement side walls 31 has at least one through hole 310 that horizontally penetrates the reinforcement side wall, so that the two-phase coolant can be refilled to an air bubble generation region in a sidewise direction, so as to further improve the immersion-type heat dissipation effect.

Third Embodiment

Figure 6:
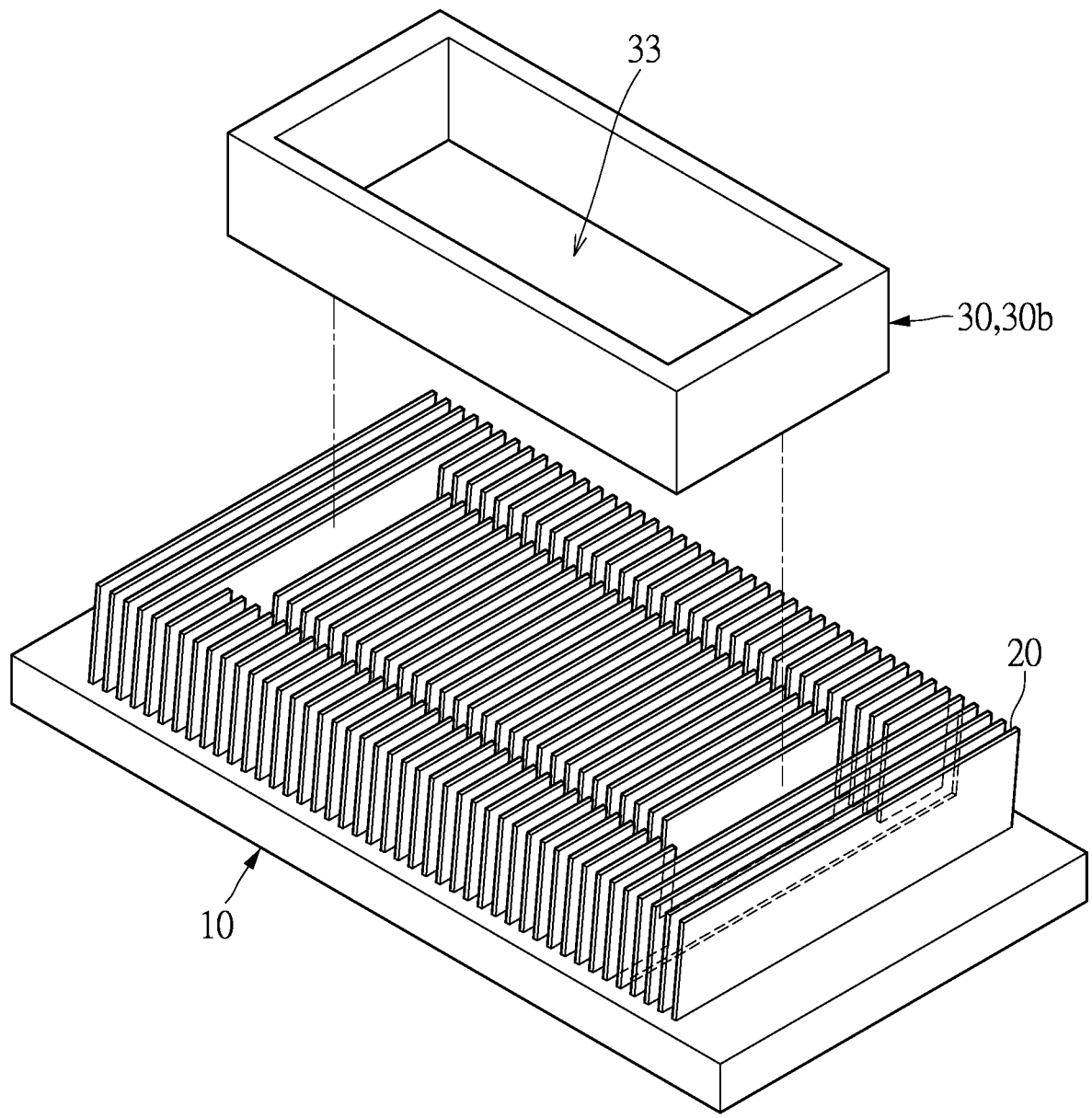
FIG. 6 is a perspective exploded view of the two-phase immersion-type heat dissipation structure according to a third embodiment of the present disclosure.

Referring to FIG. 6, a third embodiment of the present disclosure is substantially the same as the first embodiment, and the difference therebetween is described as follows.

In this embodiment, the reinforcement structure 30 can be a rectangular reinforcement inner frame 30b and the rectangular reinforcement inner frame 30b is bonded to the upper surface of the heat dissipation substrate 10. Further, at least a portion of the plurality of sheet-like heat dissipation fins 20 are located in an opening 33 formed by an inner periphery of the reinforcement inner frame 30b, and another portion of the plurality of sheet-like heat dissipation fins 20 are surroundingly arranged along an outer periphery of the reinforcement inner frame 30b.

Beneficial Effects of the Embodiments

In conclusion, in the two-phase immersion-type heat dissipation structure having high density heat dissipation fins of the present disclosure, by virtue of "the plurality of sheet-like heat dissipation fins being integrally formed on an upper surface of the heat dissipation substrate and arranged in high density," "a bottom surface of the heat dissipation substrate being in contact with a heating element immersed in a two-phase coolant," "an angle between at least one of the plurality of sheet-like heat dissipation fins and the upper surface of the heat dissipation substrate being from 60 degrees to 120 degrees," "a length of at least one of the plurality of sheet-like heat dissipation fins being from 50 mm to 120 mm, a width of at least one of the plurality of sheet-like heat dissipation fins being from 0.1 mm to 0.35 mm, and a height of at least one of the plurality of sheet-like heat dissipation fins being from 2 mm to 8 mm," "at least two adjacent ones of the plurality of sheet-like heat dissipation fins that are in parallel arrangement being spaced apart from each other by a distance that is from 0.05 mm to 0.5 mm," and "a material of the reinforcement structure being different from a material of the heat dissipation substrate, and the reinforcement structure being bonded to the heat dissipation substrate, so that at least a portion of the reinforcement structure protrudes from the upper surface of the heat dissipation substrate by between 2 mm and 20 mm," an overall immersion-type heat dissipation effect and an overall structural integrity can be effectively improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-type heat dissipation structure having sheet-like heat dissipation fins, comprising:
   a heat dissipation substrate, wherein a bottom surface of the heat dissipation substrate is in contact with a heating element immersed in a two-phase coolant;
   a plurality of sheet-like heat dissipation fins, wherein a length of at least one of the plurality of sheet-like heat dissipation fins is from 50 mm to 120 mm, a width of at least one of the plurality of sheet-like heat dissipation fins is from 0.1 mm to 0.35 mm, and a height of at least one of the plurality of sheet-like heat dissipation fins is from 2 mm to 8 mm; and
   a reinforcement structure being bonded to the heat dissipation substrate, so that a portion of the reinforcement structure protrudes from an upper surface of the heat dissipation substrate by between 2 mm and 20 mm;

wherein at least two adjacent ones of the plurality of sheet-like heat dissipation fins that are in parallel arrangement are spaced apart from each other by a distance that is from 0.05 mm to 0.5 mm;

wherein the plurality of sheet-like heat dissipation fins are integrally formed on the upper surface of the heat dissipation substrate, wherein an angle between at least one of the plurality of sheet-like heat dissipation fins and the upper surface of the heat dissipation substrate is from 60 degrees to 120 degrees;

wherein a material of the reinforcement structure is different from a material of the heat dissipation substrate;

wherein a Young's modulus of the reinforcement structure is greater than a Young's modulus of the heat dissipation substrate;

wherein the reinforcement structure is a reinforcement outer frame, an outer periphery of the heat dissipation substrate has an outer protruding portion protruding therefrom, and the outer protruding portion is embedded into an inner periphery of the reinforcement outer frame.

2. The two-phase immersion-type heat dissipation structure according to claim 1, wherein the length of at least one of the plurality of sheet-like heat dissipation fins is from 50 mm to 80 mm, the width of at least one of the plurality of sheet-like heat dissipation fins is from 0.1 mm to 0.3 mm, and the height of at least one of the plurality of sheet-like heat dissipation fins is from 3 mm to 6 mm, wherein at least two adjacent ones of the plurality of sheet-like heat dissipation fins that are in parallel arrangement are spaced apart from each other by the distance that is from 0.1 mm to 0.3 mm.

3. The two-phase immersion-type heat dissipation structure according to claim 1, wherein the heat dissipation substrate is made of copper, copper alloy, or aluminum alloy.

4. The two-phase immersion-type heat dissipation structure according to claim 1, wherein the reinforcement structure is bonded to the heat dissipation substrate by soldering, friction stir welding, gluing, diffusion bonding, or press-bonding.

5. The two-phase immersion-type heat dissipation structure according to claim 1, wherein the reinforcement structure is made of aluminum alloy or stainless steel.

6. The two-phase immersion-type heat dissipation structure according to claim 1, wherein a surface of the reinforcement structure for being bonded with the heat dissipation substrate has a plating layer formed thereon for facilitating a soldering process.

7. The two-phase immersion-type heat dissipation structure according to claim 6, wherein the plating layer is an electroless nickel plating layer.

8. The two-phase immersion-type heat dissipation structure according to claim 1, wherein the reinforcement outer frame has two reinforcement side walls that are oppositely disposed, and at least one of the reinforcement side walls has at least one through hole that horizontally penetrates the reinforcement side wall.

9. The two-phase immersion-type heat dissipation structure according to claim 1, wherein the reinforcement structure is a reinforcement inner frame and is bonded to the upper surface of the heat dissipation substrate, wherein at least a portion of the plurality of sheet-like heat dissipation fins are located in an opening formed by an inner periphery of the reinforcement inner frame, and another portion of the plurality of sheet-like heat dissipation fins are surroundingly arranged along an outer periphery of the reinforcement inner frame.

* * * * *